United States Patent
Mieno

(10) Patent No.: US 8,420,466 B2
(45) Date of Patent: *Apr. 16, 2013

(54) METHOD OF FORMING TFT FLOATING GATE MEMORY CELL STRUCTURES

(75) Inventor: Fumitake Mieno, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 122 days.

This patent is subject to a terminal disclaimer.

(21) Appl. No.: 12/259,165

(22) Filed: Oct. 27, 2008

(65) Prior Publication Data

US 2010/0001282 A1    Jan. 7, 2010

(30) Foreign Application Priority Data

Jul. 3, 2008 (CN) .......................... 2008 1 0040295

(51) Int. Cl.
| | |
|---|---|
| *H01L 21/00* | (2006.01) |
| *H01L 21/84* | (2006.01) |
| *H01L 21/336* | (2006.01) |
| *H01L 21/8234* | (2006.01) |
| *H01L 21/8238* | (2006.01) |
| *H01L 21/44* | (2006.01) |
| *H01L 29/76* | (2006.01) |
| *H01L 29/788* | (2006.01) |

(52) U.S. Cl.
USPC ........... 438/161; 438/197; 438/216; 438/257; 438/680; 257/314; 257/315; 257/E29.129

(58) Field of Classification Search .......................... None
See application file for complete search history.

(56) References Cited

U.S. PATENT DOCUMENTS

| | | | |
|---|---|---|---|
| 6,841,813 B2 * | 1/2005 | Walker et al. ................. | 257/278 |
| 7,242,049 B2 * | 7/2007 | Forbes et al. ................. | 257/315 |
| 2003/0057435 A1 | 3/2003 | Walker | |

(Continued)

FOREIGN PATENT DOCUMENTS

CN            101202233 A         6/2008

OTHER PUBLICATIONS

Office Action of Chinese Application No. 200810040295.X, dated May 27, 2010, 6 pages total (English translation not included).

*Primary Examiner* — N. Drew Richards
*Assistant Examiner* — Michael Jung
(74) *Attorney, Agent, or Firm* — Kilpatrick Townsend & Stockton

(57) ABSTRACT

A device having thin-film transistor (TFT) floating gate memory cell structures is provided. The device includes a substrate, a dielectric layer on the substrate, and one or more source or drain regions being embedded in the dielectric layer. the dielectric layer being associated with a first surface. Each of the one or more source or drain regions includes an $N^+$ polysilicon layer on a diffusion barrier layer which is on a first conductive layer. The $N^+$ polysilicon layer has a second surface substantially co-planar with the first surface. Additionally, the device includes a $P^-$ polysilicon layer overlying the co-planar surface and a floating gate on the $P^-$ polysilicon layer. The floating gate is a low-pressure CVD-deposited silicon layer sandwiched by a bottom oxide tunnel layer and an upper oxide block layer. Moreover, the device includes at least one control gate made of a $P^+$ polysilicon layer overlying the upper oxide block layer. A method of making the same memory cell structure is provided and can be repeated to integrate the structure three-dimensionally.

19 Claims, 6 Drawing Sheets

U.S. PATENT DOCUMENTS

2006/0051911 A1* 3/2006 Gu et al. .................. 438/166
2007/0045724 A1* 3/2007 Lim et al. ................. 257/330
2007/0126033 A1* 6/2007 Walker et al. ............. 257/250
2007/0187768 A1* 8/2007 Duan et al. ................ 257/368

* cited by examiner

METHOD OF FORMING TFT FLOATING GATE MEMORY CELL STRUCTURES

CROSS-REFERENCE TO RELATED APPLICATIONS

This application claims priority to Chinese Patent Application No. 200810040295.X, filed Jul. 3, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method for making semiconductor device having a memory cell. Merely by way of example, the invention has been applied to a thin film transistor (TFT) memory cell structure including a floating gate and a method for making the same cell structure and forming three-dimensional array. But it would be recognized that the invention has a much broader range of applicability. For example, the invention can be applied to a variety of devices having a control gate and a floating gate as memory storage element, such as dynamic random access memory devices, static random access memory devices, flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

Over the past, reducing memory devices have been a challenging task. As an example, for non-volatile memory devices the high density memory development is hindered by the inability to scale down the memory cell size without reducing the memory capacitance per unit area. In the past, various conventional techniques have been developed for memory cell structures with reduced dimensions. Unfortunately, these conventional techniques have often been inadequate.

From the above, it is seen that an improved device design and technique for processing semiconductor devices, particularly the three-dimensional (3D) memory cell structure, is desired.

BRIEF SUMMARY OF THE INVENTION

The present invention is directed to integrated circuits and their processing for the manufacture of semiconductor devices. More particularly, the invention provides a method for making semiconductor device having a memory cell. Merely by way of example, the invention has been applied to a thin film transistor (TFT) memory cell structure including a floating gate and a method for making the same cell structure and forming three-dimensional array. But it would be recognized that the invention has a much broader range of applicability. For example, the invention can be applied to a variety of devices having a control gate and a floating gate as memory storage element, such as dynamic random access memory devices, static random access memory devices, flash memory devices, and others.

In a specific embodiment, the invention provides a method of making a TFT floating gate memory cell structure. The method includes providing a substrate, forming a first insulation layer on the substrate, and forming one or more source or drain regions on the first insulation layer. Each of the one or more source or drain regions is associated with a first surface and includes an $N^+$ polysilicon layer, a barrier layer, and a conductive layer. The $N^+$ polysilicon layer is located on the barrier layer which overlays the conductive layer. The first surface consists of $N^+$ polysilicon. Additionally, the method includes forming a second insulation layer on the first insulation layer. The second insulation layer is associated with a second surface which is substantially co-planar with the first surface. The method further includes forming a $P^-$ polysilicon layer overlying the first surface and the second surface. The $P^-$ polysilicon layer is capable of forming a channel from the source region to the drain region. Moreover, the method includes forming a silicon layer sandwiched by an upper silicon dioxide block layer and a bottom silicon dioxide tunnel layer on the $P^-$ polysilicon layer. The silicon layer is capable of forming a floating gate. Furthermore, the method includes forming a $P^+$ polysilicon layer on the upper silicon dioxide block layer and forming at least one control gate by patterning the $P^+$ polysilicon layer.

In another specific embodiment, the invention provides a device with thin-film transistor (TFT) floating gate memory cell structure. The device includes a substrate and a dielectric layer on the substrate. The dielectric layer is associated with a first surface. The device further includes one or more source or drain regions being embedded in the dielectric layer. Each of the one or more source or drain regions includes an $N^+$ polysilicon layer, a diffusion barrier layer, and a first conductive layer. The $N^+$ polysilicon layer is located on the diffusion barrier layer which overlays the first conductive layer. The $N^+$ polysilicon layer has a second surface substantially co-planar with the first surface. Additionally, the device includes a $P^-$ polysilicon layer overlying the first surface and the second surface. The method further includes a silicon layer on the $P^-$ polysilicon layer. The silicon layer is sandwiched by an upper oxide block layer and a bottom oxide tunnel layer. Moreover, the device includes a second conductive layer overlying the upper oxide block layer and at least one control gate made from patterning the second conductive layer.

In yet another specific embodiment, the combination of $N^+$ polysilicon source region, $P^-$ polysilicon channel layer, and next $N^+$ polysilicon drain region is capable of forming a thin-film-transistor (TFT) located under a charge storing silicon floating gate layer. The TFT can act as an access device for the memory cell. In one embodiment, the TFT floating gate memory cell structure made by the method can be repeatedly integrated in three dimension (3D). Furthermore, in another embodiment, the whole memory cell structure can be implemented in a cross-point memory architecture in which each memory storage element, within the silicon floating gate layer, can be sandwiched between an array of orthogonal word lines and bit lines.

Many benefits can be achieved by way of the present invention over conventional techniques. According to certain embodiments, the present invention combines the advantages of high reliability of CVD silicon floating gate for charge-trapping, small geometric cell size and layered structure, high field effect mobility using a polysilicon thin-film transistor as the access device, and low thermal budget for fabrication and dopant activation within temperature ranges tolerated by the memory cell. In addition, the present invention provides a simple process that is compatible with conventional CMOS process technology without substantial modifications to conventional equipment and processes. In certain embodiments, the method provides a process to form a thin-film transistor based on polysilicon deposited using low-pressure chemical vapor deposition (LPCVD) and certain post-deposition annealing that meets the stackability and thermal budget constraint for 3D memory array. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method for making semiconductor device having a memory cell. Merely by way of example, the invention has been applied to a thin film transistor (TFT) memory cell structure including a floating gate and a method for making the same cell structure and forming three-dimensional array. But it would be recognized that the invention has a much broader range of applicability. For example, the invention can be applied to a variety of devices having a control gate and a floating gate as memory storage element, such as dynamic random access memory devices, static random access memory devices, flash memory devices, and others.

As discuss above, various conventional techniques have been directed to memory cells with reduced sizes. According to one of the conventional techniques, memory cells are implemented with stacked gate structure. For example, a stack structure is programmed using one or more channel hot-electrons that pass through a source region and a channel region and is then erased by a Fowler-Norheim tunneling effect.

Unfortunately, stacked gate cell structures, being of two-dimensional array type, usually have a smaller memory capacity per unit area as the cell size scales down. One feasible solution is to stack three-dimensionally several layers of memory arrays on top of a Si substrate containing the CMOS support circuitry. According to various embodiments, the present invention provides three dimensional memory cell structures. For example, certain embodiments of the present invention provides an ability to fabricate stackable access device in the memory cell. This brings up an requirement to improve the design of memory cell structure that can fulfill one or more of the following attributes including, stacking ability, small geometry, low leakage current, bi-directional operable, easy integration into a low temperature backend CMOS flow, cost effectiveness, efficiency, etc. Accordingly, various embodiments of the present invention provide a thin-film-transistor (TFT) floating gate memory cell structure. It is to be understood that the term "TFT floating gate" refers to a class of memory cell structures and is broadly defined. For example, a "TFT floating gate" memory cell structure may be illustrated according to FIG. 1.

Figure 1:
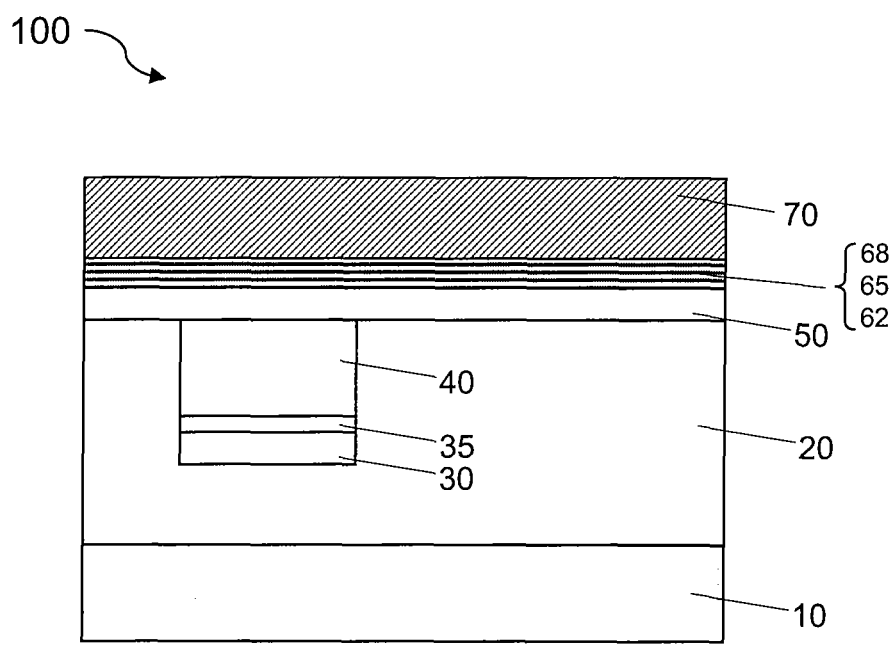
FIG. 1 is a simplified side-view diagram of a TFT floating gate memory cell according to an embodiment of the present invention.

FIG. 1 is a simplified diagram for a semiconductor device 100 with a TFT floating gate memory cell structure that is capable of being stacked three-dimensionally. This diagram is merely an example, which should not unduly limit the scope of the claims. One of ordinary skill in the art would recognize many variations, alternatives, and modifications. The device 100 includes following components:

1. Substrate 10;
2. Dielectric layer 20;
3. Conductive layer 30;
4. Diffusion barrier layer 35;
5. One or more N+ polysilicon source or drain region 40;
6. P− polysilicon channel layer 50;
7. Floating gate layer 65; and
8. Control gate region 70.

Although the above has been shown using a selected group of components for the device 100, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particular below.

In one embodiment, the substrate 10 is made of a semiconductor material. For example, the semiconductor material is silicon. In another example, the substrate 10 includes a plurality of semiconductor devices such as TFT floating gate memory arrays with dielectric passivation.

The dielectric layer 20 is located on the substrate 10. In one embodiment, at least part of the dielectric layer 20 consists of silicon dioxide formed through thermal oxidation process on a silicon substrate. In another embodiment, the dielectric layer 20 is silicon oxide deposited by high-density-plasma (HDP) assisted chemical vapor deposition or is TEOS deposited silicon oxide.

There are one or more confined regions embedded in the dielectric layer 20. Each of these confined region contains a conductive layer, a diffusion barrier layer, and a semiconductor source or drain region. In an exemplar confined region as shown in FIG. 1, the conductive layer 30 is located at the bottom and the diffusion barrier layer 35 overlays the conductive layer 30, followed by an N$^+$ polysilicon layer 40. The N$^+$ polysilicon layer 40 is a heavily doped n-type polysilicon layer and has a surface co-planar with the surface of the dielectric layer 20. In one embodiment, the N$^+$ polysilicon layer 40 is capable of forming a source or drain region for the device 100. The n-type source or drain region 40 is conductively connected to the conductive layer 30 through the diffusion barrier layer 35. In another embodiment, the conductive layer 30 is capable of coupling electrically with the memory bitlines (not shown in FIG. 1) to perform programming or erasing function for the memory cell. In yet another embodiment, the conductive layer 30 is a material containing metal or metal alloy material. For example, the material is titanium silicide. In another example, the diffusion barrier layer 35 is titanium nitride.

Referring to FIG. 1, the N$^+$ polysilicon source or drain region 40 contains poly-crystalline silicon which is located at the top part within the confined region embedded in dielectric region 20. In one embodiment, the polycrystalline silicon is doped heavily with n-type dopants (e.g., As, P, etc) to be conductive with electrons as its majority carrier. As seen in FIG. 1, in another embodiment, the N$^-$ polysilicon source or drain region 40 has a co-planar surface with the dielectric layer 20.

Referring again to FIG. 1, the P$^-$ polysilicon layer 50 is located on the co-planar surface of the N$^+$ polysilicon source or drain region 40 and the dielectric layer 20. The P$^-$ polysilicon layer 50 is a light-doped p-type poly-crystalline silicon layer. In one example, the P$^-$ polysilicon layer is doped with p-type dopants (e.g., B, Ga, etc) with holes as its majority carrier. In one embodiment, the P$^-$ polysilicon layer 50 is at least partially in direct contact with the N$^+$ polysilicon source or drain region 40. Referring to FIG. 1, in another embodiment, P$^-$ polysilicon layer 50 overlying the confined N$^-$ polysilicon source or drain region 40 form a p-channel of an n-p-n polysilicon thin-film-transistor (TFT) in the device 100. In one specific embodiment, the p-channel TFT can be utilized as a memory access device for the device 100.

Referring to FIG. 1, a floating gate 65 is located on the P$^-$ polysilicon layer 50. In an embodiment, the floating gate 65 is sandwiched by a bottom oxide layer 62 and an upper oxide layer 68. In another embodiment, the bottom oxide layer 62 is located between the P$^-$ polysilicon layer 50 and the floating gate 65. In yet another embodiment, an upper oxide layer 68 overlays the floating gate 65. In a specific embodiment, the floating gate is made of a silicon layer using low-pressure chemical vapor deposition (LPCVD) technique followed by a thermal annealing process. The bottom oxide layer 62 and the upper oxide layer 68 are made of CVD-deposited silicon dioxide. In another embodiment, the lower oxide layer 62 forms a tunnel barrier for high mobility hot carriers to be injected into the floating gate 65 from a drain region by the applied programming electric field in p-channel TFT. In yet another embodiment, the upper oxide layer 68 forms a blocking dielectric or gate insulation layer for blocking the charge leakage out of the charge trapping floating gate. In one example, the charge amount trapped in the CVD-deposited silicon floating gate may be fine tuned and controlled to store 4 or more bits per cell.

Referring back to FIG. 1, the device 100 further includes at least one control gate region 70 for the memory cell. The control gate region 70 is formed by patterning a P$^+$ polysilicon layer overlying the upper oxide layer 68. The patterned control gate region 70 is located at least over one confined N$^+$ polysilicon source or drain region 40 where a p-channel TFT is formed by overlying a P$^-$ polysilicon layer 50 directly on a pair of regions 40. The pattern geometry of the control gate region 70 is not specifically shown in FIG. 1, which is merely an example and one of ordinary skill in the art would recognize many variations, alternatives, and modifications of the control gate region 70 as well as their interconnections. For example, the control gate region 70 can be electrically coupled to the memory array wordlines (not shown) which may be orthogonal to the memory bitlines coupled to the conductive layer 30. In one embodiment, the second conductive layer where the control gate region 70 of the memory cell 100 is formed is preferably a material with high work function to suppress the parasitic gate erase current. The P$^+$ polysilicon layer used for making the control gate region 70 is a heavily doped p-type polycrystalline silicon layer. Or course, the control gate region 70 can be formed alternatively of at least one material layer selected from the group including a tungsten layer, a silicon germanium layer, a silicon germanium carbide layer, a molybdenum layer, a molybdenum silicide layer, a titanium layer, an aluminum later, a titanium silicide layer, and titanium nitride layer, and preferably for device 100, it is formed of a polycrystalline silicon layer heavily doped to p-type.

According to an embodiment of the present invention, the device 100 with a TFT floating gate memory cell structure can be repeated laterally to form a memory array. The memory array further can be passivated with an inter-layer dielectrics with a plurality of metal interconnects and/or contacts to the gate, source or drain regions. In another embodiment, the passivation layer can be further planarized to form a substrate for stacking or direct making a plurality of the devices 100 again. In yet another embodiment, the present invention provides a TFT floating gate memory cell structure that can be integrated in multiple layers to form a three-dimensional memory array.

Figure 2:
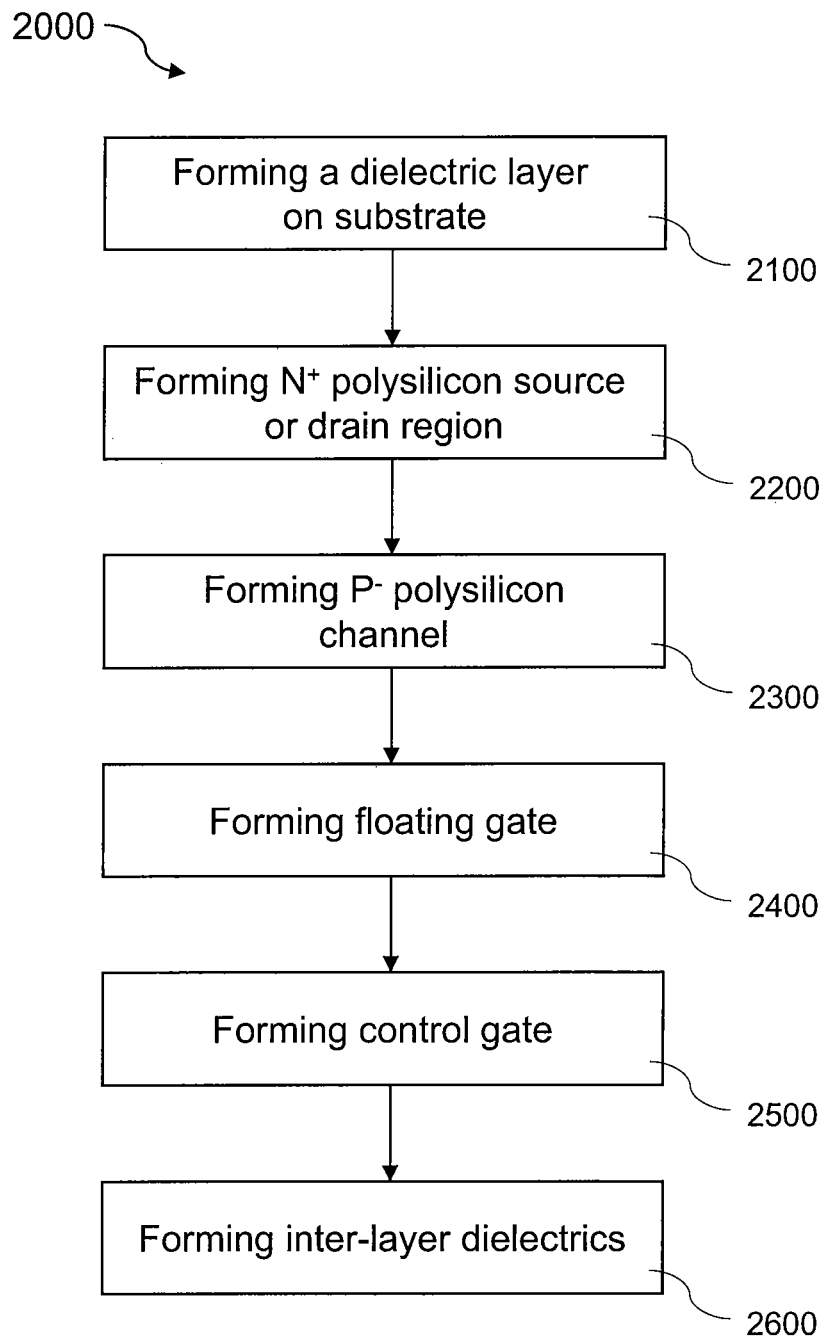
FIG. 2 is a simplified diagram showing a method of manufacturing a TFT floating gate memory cell structure according to an embodiment of the present invention.

FIG. 2 is a simplified diagram showing a method for manufacturing a TFT floating gate memory cell structure according to an embodiment of the present invention. This diagram is merely an example, which should not unduly limit the scope of the claims herein. The method 2000 includes the following processes:

1. Process 2100 for forming a first insulation layer on a substrate;
2. Process 2200 for forming N⁺ polysilicon source or drain region;
3. Process 2300 for forming P⁻ polysilicon channel;
4. Process 2400 for forming floating gate;
5. Process 2500 for forming control gate; and
6. Process 2600 for forming inter-layer dielectrics.

The above sequence of processes provides a method according to an embodiment of the present invention. Other alternatives can also be provided where processes are added, one or more processes are removed, or one or more processes are provided in a different sequence without departing from the scope of the claims herein. For example, the semiconductor device with a TFT floating gate memory cell structure made by the method 2000 is the device 100. Further details of the present invention can be found throughout the present specification and more particularly below.

Figure 3A:
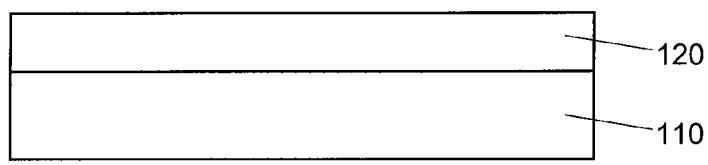
FIG. 3A is a simplified diagram showing a method of forming a first insulation layer on a substrate for making a TFT floating gate memory cell structure according to an embodiment of the present invention.

At the process 2100, an insulation layer is formed on a substrate. FIG. 3A shows a simplified method for forming an insulation layer for manufacturing a semiconductor device with a TFT floating gate memory cell structure according to an embodiment of the present invention. This diagram is merely an example, which should not unduly limit the scope of the claims. One of ordinary skill in the art would recognize many variations, alternatives, and modifications.

As shown in FIG. 3A, a starting substrate 110 is provided. For example, the substrate 110 includes silicon. In another example, the substrate 110 includes a plurality of semiconductor devices including a plurality of CMOS memory devices embedded in inter-layer dielectrics with passivation. On the substrate 110, a first insulation layer 120 is formed. In one embodiment, the first insulation layer 120 includes silicon dioxide. For example, the silicon dioxide is formed by thermal oxidation process. In another example, the silicon dioxide layer is deposited by using high-density plasma chemical vapor deposition (HDP-CVD) technique.

Referring to FIG. 2 at process 2200, one or more N⁻ polysilicon source or drain regions are formed. FIGS. 3B, 3C, 3D, and 3E show a simplified method for forming one N⁺ polysilicon source or drain region for manufacturing a semiconductor device with TFT floating gate memory cell structures according to an embodiment of the present invention. These diagrams are merely examples, which should not unduly limit the scope of the claims. One of ordinary skill in the art would recognize many variations, alternatives, and modifications. For example, the process 2200 can be implemented to make the device 100.

Figure 3B:
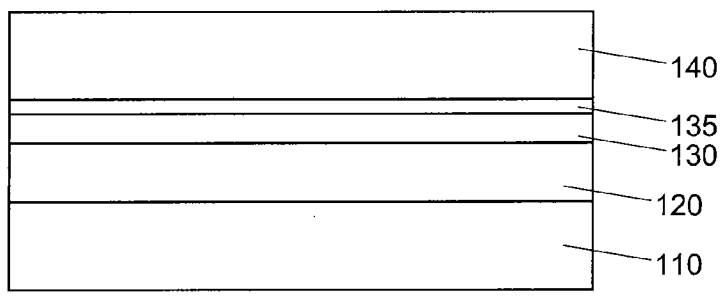
FIG. 3B is a simplified diagram showing a method of forming a conductive layer, a diffusion barrier layer, and a N+ polysilicon layer sequentially for making a TFT floating gate memory cell structure according to an embodiment of the present invention.

As shown in FIG. 3B, on the first insulation layer 120 a first conductive layer 130, a diffusion barrier layer 135, and an N⁺ polysilicon layer 140 are formed sequentially. In one embodiment, the first conductive layer 130 is made of a metal silicide material. The metal silicide is capable of forming a contact pad for electric coupling. In another embodiment, the first conductive layer 130 can be electrically coupled with memory array bitlines (not shown) embedded in the first insulation layer 120 along a certain direction. In an example, the conductive layer 130 is titanium silicide ($TiSi_2$). In another example, the $TiSi_2$ layer can be formed by various deposition techniques including evaporation, sputtering or CVD. For example, $TiSi_2$ layer is formed through thermal CVD using gas mixture of $SiH_4$ and $TiCl_4$ etc followed by a thermal annealing at 600-800° C.

In yet another embodiment, to reduce the metal inter-diffusion issue, a diffusion barrier layer 135 is deposited overlying the first conductive layer 130 prior the formation of polysilicon layer. For example, the diffusion barrier layer 135 is made of titanium nitride (TiN) material. In another example, TiN layer is deposited with low-pressure chemical vapor deposition (LPCVD) or physical vapor deposition (PVD). Referring again to FIG. 3B, an N⁺ polysilicon layer 140 is formed on the diffusion barrier layer 135. In one example, the N⁺ polysilicon layer 140 is deposited through a low pressure CVD with flowing of $SiH_4/PH_3/H_2$ gas mixture at a temperature ranging from 400 to 600 Degrees Celsius, wherein phosphorus is the n-type dopant impurity. Other alternative methods such as plasma-enhanced CVD and atomic layer deposition (ALD) techniques can be used to form the N⁺ polysilicon layer 140. Obviously, one of ordinary skill in the art would recognize many other alternatives of the N⁺ polysilicon formation including its dopant types.

Figure 3C:
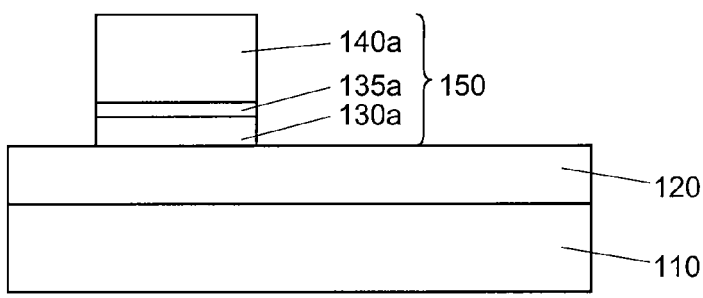
FIG. 3C is a simplified diagram showing a method of forming a source or drain region for making a TFT floating gate memory cell structure according to an embodiment of the present invention.

Still at process 2200, referring to FIG. 3C, according to an embodiment of the present invention, patterning and etching are performed with the sequential layers of 130, 135, and 140. In one embodiment, the patterning is performed with the application of a photoresist layer followed by the UV light exposure under a patterned photo mask. Developing the photoresist layer and strip-cleaning the exposed resist material lead to a surface consisting of partially revealed N⁺ polysilicon layer 140 and one or more confined regions that are still covered by the resist layer. Furthermore, plasma etching is performed to remove the layers of 130, 135, and 140 that are unmasked until the first insulation layer 120 is revealed. The etching process is anisotropic so that the regions covered by the resist layer pattern are remained. After the resist layer is removed, one or more confined regions 150 are formed as shown in FIG. 3C. In one embodiment, each of the one or more confined regions 150 includes confined portions of N⁺ polysilicon layer 140*a*, a diffusion barrier layer 135*a*, and a first conductive layer 130*a*. The confined N⁺ polysilicon layer 140*a* is located on the confined diffusion barrier layer 135*a* which overlays the confined first conductive layer 130*a*.

Figure 3D:
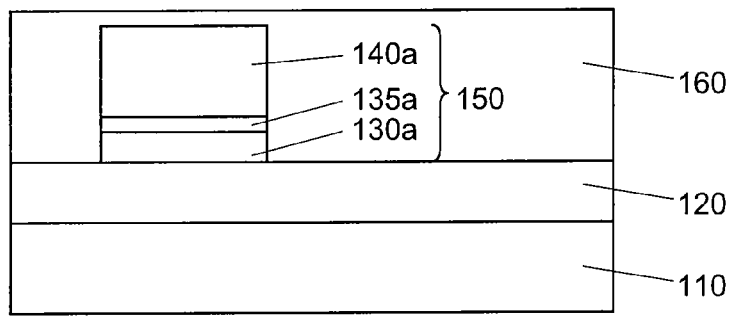
FIG. 3D is a simplified diagram showing a method of forming a second insulation layer around the source or drain region for making a TFT floating gate memory cell structure according to an embodiment of the present invention.

Additionally at process 2200, a second insulation layer 160 is added to completely cover the formed one or more confined regions 150 and the exposed area of the first insulation layer 120, as shown in FIG. 3D. In one embodiment, the second insulation layer 160 includes silicon oxide. For example, the silicon oxide is deposited with high-density-plasma (HDP) Chemical Vapor Deposition. In another example, the silicon oxide is tetraethyl orthosilicate TEOS deposited silicon oxide.

Figure 3E:
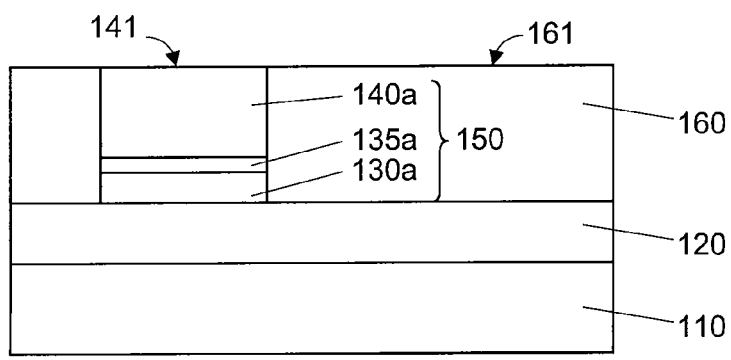
FIG. 3E is a simplified diagram showing a method of forming a co-planar surface of the source or drain region and the second insulation layer for making a TFT floating gate memory cell structure according to an embodiment of the present invention.

Referring to FIG. 3E, still at process 2200, a chemical-mechanical planarization (CMP) process is performed to remove extra amount of the second insulation layer 160 until the N⁺ polysilicon layer 140*a* in the confined regions 150 is revealed and a co-planarized surface is formed. The CMP planarized surface includes at least partially the first surface 141 of the N⁺ polysilicon layer in the regions 140*a* and partially the second surface 161 of the second insulation layer 160. In another embodiment, combination of a CMP process and a dry etching process or the dry etching process alone can be used to remove extra amount of the second insulation layer 160. In yet another embodiment of the present invention, the second insulation layer 160 is deposited around the confined regions 150 (as shown in FIG. 3C) until the second surface 161 of the second insulation layer 160 is a substantially co-planar with the first surface 141 of the N⁺ polysilicon in regions 140*a*. The N⁺ polysilicon layer 140*a* within each of the one or more confined regions 150 is embedded in the second insulation layer 150 with a co-planar surface and capable of forming a source or drain region of a memory device. For example, the memory device is the device 100.

Figure 3F:
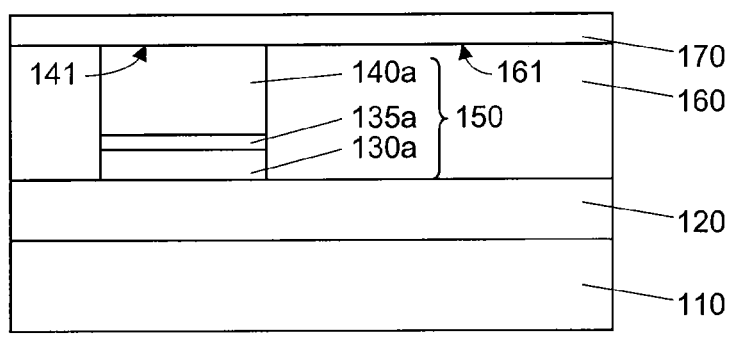
FIG. 3F is a simplified diagram showing a method of forming an n-p-n polysilicon TFT for making a TFT floating gate memory cell structure according to an embodiment of the present invention.

Referring back to FIG. 2 at process 2300, a P⁻ polysilicon channel layer is formed. FIG. 3F shows a simplified method for forming a P⁻ polysilicon channel for manufacturing a semiconductor device with TFT floating gate memory cell structures according to an embodiment of the present invention. This diagram is merely an example, which should not unduly limit the scope of the claims. One of ordinary skill in the art would recognize many variations, alternatives, and modifications.

As shown in FIG. 3F, a P⁻ polysilicon layer 170 is formed overlying the surface 141 of the N⁺ polysilicon layer 140a in the confined region 150 and the surface 161 of the second insulation layer 160. The P⁻ polysilicon is a lightly doped p-type polycrystalline silicon. The P⁻ polysilicon layer is made by depositing $SiH_4/B_2H_6$ mixture using low pressure chemical vapor deposition (LPCVD) at a temperature ranging from 520 Degrees Celsius to 560 Degrees Celsius. After the deposition a thermal annealing process is preferably performed at the same temperature range according to an embodiment. Alternatively, the P⁻ polysilicon layer is made by depositing $Si_2H_6/B_2H_6$ mixture using low pressure chemical vapor deposition (LPCVD) at a temperature ranging from 420 Degrees Celsius to 520 Degrees Celsius. After the deposition a thermal annealing process is preferably performed at the same temperature range. Of course, one of ordinary skill in the art would recognize many other alternatives of the P⁻ polysilicon layer formation including its dopant types. In one embodiment, the P⁻ polysilicon layer 170 is at least partially in contact with the surface 141 of the N⁺ polysilicon layer 140a in the confined regions 150. In another embodiment, the P⁻ polysilicon layer is capable of forming a p-channel connecting a n-type source region and a n-type drain region, each of the source and drain region is made of N⁺ polysilicon layer located in a neighboring regions 140a. In another embodiment, such a polysilicon n-p-n junction forms a polysilicon thin-film transistor capable of functioning as an access device for the memory cell.

Figure 3G:
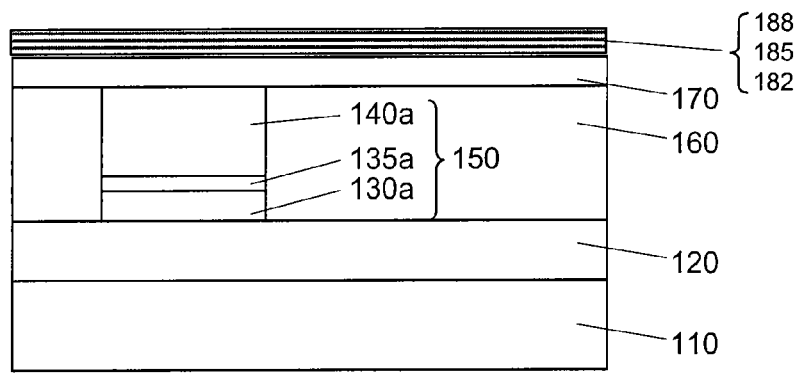
FIG. 3G is a simplified diagram showing a method of forming a floating gate for making a TFT floating gate memory cell structure according to an embodiment of the present invention.

Referring again to FIG. 2 at process 2400, a floating gate is formed. FIG. 3G shows a simplified method for forming a floating gate for manufacturing a semiconductor device with TFT floating gate memory cell structures according to an embodiment of the present invention. This diagram is merely an example, which should not unduly limit the scope of the claims. One of ordinary skill in the art would recognize many variations, alternatives, and modifications.

Referring to FIG. 3G, a floating gate 185 is formed on the P⁻ polysilicon layer 170. The floating gate 185 is a CVD-deposited silicon layer sandwiched by a bottom oxide layer 182 and an upper oxide layer 188. In a specific embodiment, the floating gate 185 is formed using low-pressure CVD with silene $SiH_4$ as precursor at a temperature ranging from 520 Degrees Celsius to 560 Degrees Celsius followed by a thermal annealing process under the same temperature. In another specific embodiment, the floating gate 185 is formed using low-pressure CVD with disilene $Si_2H_6$ as precursor at a temperature ranging from 420 Degrees Celsius to 520 Degrees Celsius followed by a thermal annealing process under the same temperature. can be used as the charge trapping layer for memory storage. The CVD processes can be modified, by adjusting the pressure and temperature (through a controlled LPCVD, or RTCVD, or UHVCVD), to optimize the silicon layer morphology, grain size, and defect or impurity distribution etc. Therefore the formed silicon layer for the floating gate can have a desired thickness and reliable charge trapping property. The bottom oxide layer 182 and upper oxide layer 188 can be CVD-deposited silicon dioxide using $SiH_4$ and $O_2$ as precursors. The bottom oxide layer 182 forms a tunnel barrier separating the floating gate 185 made of CVD silicon layer from the P⁻ polysilicon layer 170. When a bias voltage is applied between the N⁺ polysilicon source and a neighbor drain regions 140a, the high mobility hot electrons within the P⁻ polysilicon channel layer may be injected through the bottom oxide layer 182 into the silicon floating gate 185 by the programming electric field. The upper oxide layer 188 forms a blocking oxide or gate insulation layer, setting a high barrier for the retention of the charges stored in the floating gate 185. In one embodiment, the thicknesses of both upper oxide layer 188 and the bottom oxide layer 182 can be optimized, together with the thickness of silicon floating gate 185, to provide a reduced equivalent total oxide thickness to improve both the access time and charge retention.

Figure 3H:
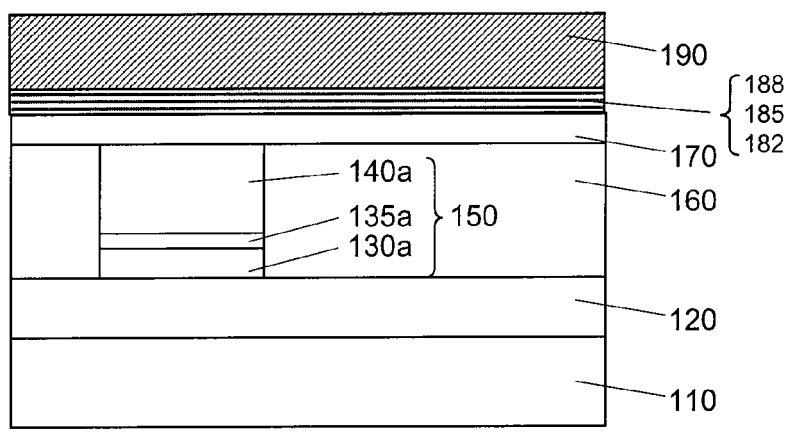
FIG. 3H is a simplified diagram showing a method of forming a control gate for making a TFT floating gate memory cell structure according to an embodiment of the present invention.

At process 2500, a control gate is formed. FIG. 3H shows a simplified method for forming a control gate for manufacturing a semiconductor device having TFT floating gate memory cell structures according to an embodiment of the present invention. This diagram is merely an example, which should not unduly limit the scope of the claims. One of ordinary skill in the art would recognize many variations, alternatives, and modifications. For example, the process 2500 of the invented method is implemented to make the control gate for the device 100.

As shown in FIG. 3H, a P⁺ polysilicon layer 190 is deposited overlying the upper oxide layer 188. The P⁺ polysilicon layer deposition can be performed using low-pressure CVD with $SiH_4/B_2H_6$ gas mixture at a temperature range from 400 Degrees Celsius to 600 Degrees Celsius followed by a post-deposition annealing treatment. Of course, there can be other process condition variations, modifications, and alternatives.

According to an embodiment of the present invention, a control gate can be formed by patterning the P⁺ polysilicon layer 190. In an embodiment, the patterned control gate is located over the floating gate 185 separated only by the upper oxide layer 188 as a gate dielectrics. In another embodiment, the control gate is patterned to align over the polysilicon p-channel of an n-p-n TFT formed at process 2300, which is associated with at least one N⁺ polysilicon source region and one N⁺ polysilicon drain region. In another embodiment, dual control gates can be formed within each memory cell. The patterning and etching processes for forming each of the control gate include known methods such as applying photoresist layer, masking, exposing light, developing resist, striping exposed resist residue, polysilicon layer etching and resist layer removing, etc.

In a specific embodiment, each of the patterned control gate can be electrically coupled with memory array wordlines. The memory array wordlines may be configured to be orthogonal to the directions of bitlines of the memory array thereof. Although the detail pattern geometry of the control gate is not explicitly illustrated in FIG. 3H, one of ordinary skilled in the art would recognize many variations, alternatives, and modifications of the gate architectures which should not unduly limit the scope of the claims. At the end of the process 2500, the formation of the control gate completes the formation of the TFT floating gate memory cell structure. For example, arrays of devices 100 can be made by the method 2000 including sequential processes from the process 2100 to the process 2500.

Figure 3I:
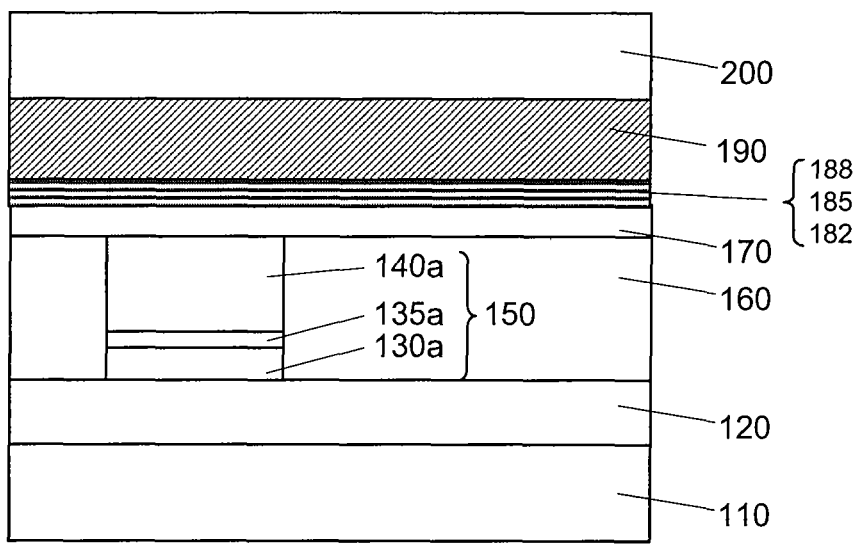
FIG. 3I is a simplified diagram showing a method of forming an inter-layer dielectrics for making three-dimensional TFT floating gate memory cell structures according to an embodiment of the present invention.

Referring back to FIG. 2 at process 2600, an inter-layer dielectrics is formed. FIG. 3I shows a simplified method of forming an inter-layer dielectrics 200 covering a device with TFT floating gate memory cell structures formed at the end of the process 2500. This diagram is merely an example, which should not unduly limit the scope of the claims. One of ordinary skill in the art would recognize many variations, alternatives, and modifications. For example, a plurality of devices with TFT floating gate memory cell structures can be formed at the end of the process 2500 prior to the formation of the inter-layer dielectrics 200. Additionally, metal interconnects (not shown) can be embedded within the inter-layer dielectrics 200 for either bitlines or wordlines of the memory arrays. In another specific embodiment, the TFT floating gate memory cell structures formed though process 2100 to 2600 is three-dimensional stackable. For example, the inter-layer dielectrics may be further planarized by a CMP or an etch back process. The planarized surface of the dielectrics can be used as a substrate. Then the sequence of processes (2100 through 2500) of the method 2000 can be repeated to form another layer of memory arrays having TFT floating gate memory cell structures.

As shown in FIG. 3H, in a specific embodiment, the invention provides a device with TFT floating gate memory cell structures. The device includes a substrate, a dielectric layer on the substrate, and one or more source or drain regions being embedded in the dielectric layer. Each of the one or more source or drain regions includes an $N^+$ polysilicon layer, a diffusion barrier layer, and a conductive layer. The $N^+$ polysilicon layer having a co-planar surface with the dielectric layer is located on the diffusion barrier layer. The diffusion barrier layer overlays the conductive layer. Additionally, the device includes a $P^-$ polysilicon layer overlying the co-planar surface of the $N^+$ polysilicon layer and the dielectric layer. Moreover, the device includes a floating gate on the $P^-$ polysilicon layer. The floating gate is a silicon layer sandwiched by a bottom oxide layer and an upper oxide layer. The device further includes at least one control gate overlying the upper oxide layer. In a specific embodiment, the control gate is made of a highly doped $P^+$ polysilicon layer.

The processes described above for manufacturing a semiconductor device with TFT floating gate memory cell structures are merely examples which should not unduly limit the scope of the claims herein. There can be many alternatives, modifications, and variations for an ordinary skill in the art. For example, some of the processes may be expanded and/or combined. Other processes may be inserted to those mentioned above. According to a specific embodiment, the method 2000 straightforwardly provides a two-dimensional array of memory cells having the same structure of device 100. According to another specific embodiment, the method 2000 can be repeated to stack the memory cell structure in multi-layers, so that a three-dimensional arrays of memory cell structures can be manufactured. The simplicity of the formation of $N^+$ polysilicon source or drain regions, the polysilicon p-channel TFT, and the CVD-silicon floating gate, followed by a polysilicon control gate provides easy 3D stackability. For example, the device 100 having TFT floating gate memory cell structures can be embedded in larger chips three-dimensionally with increased memory density per unit area in the vertical direction.

The present invention has various advantages. Some embodiments of the present invention provide a TFT floating gate memory cell structure that is capable for 3D integration. Certain embodiments of the present invention provide a polysilicon p-channel TFT in the memory cell as the memory access device due to high reliability and high field effect mobility. Some embodiments have advantages of high reliability of CVD-silicon floating gate charge-storing element, small and scalable geometric cell size, and low thermal budget for fabrication and dopant activation for the 3D memory arrays. Some embodiments of the present invention can reduce transistor leakage current and improve the charge retention time for the memory cell. Certain embodiments of the present invention provide a simple method for making 3D memory array using processes that are fully compatible with established CMOS technology.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of making a TFT floating gate memory cell structure, the method comprising:
    providing a substrate;
    forming a first insulation layer on the substrate;
    forming one or more source or drain regions on the first insulation layer, each of the one or more source or drain regions being associated with a first surface and including an n-type polysilicon layer, a barrier layer, and a conductive layer, the n-type polysilicon layer being on the barrier layer, the barrier layer overlying the conductive layer, the first surface consisting of n-type polysilicon, the conductive layer comprising a material containing a metal or a metal alloy;
    forming a second insulation layer on the first insulation layer, the second insulation layer being located between the one or more source and drain regions and associated with a second surface, the second surface being substantially co-planar with the first surface;
    forming a first p-type polysilicon layer overlying the first surface and the second surface, the first p-type polysilicon layer being capable of forming a channel from a source region to a drain region;
    forming a silicon layer sandwiched by an upper silicon dioxide block layer and a bottom silicon dioxide tunnel layer on the first p-type polysilicon layer, the silicon layer being capable of forming a floating gate;
    forming a second p-type polysilicon layer on the upper silicon dioxide block layer; and
    forming at least one control gate by patterning the second p-type polysilicon layer,
    wherein forming the silicon layer comprises:
    depositing silicon using low-pressure CVD technique with $SiH_4$ precursor at 520-560° C.; and
    annealing at 520-560° C. after deposition.

2. The method of claim 1 wherein the method of forming one or more source or drain regions on the first insulation layer further comprises:
    forming the conductive layer on the first insulation layer;
    forming the barrier layer on the conductive layer;
    forming the n-type polysilicon layer on the barrier layer; and
    patterning the n-type polysilicon layer, the barrier layer, and the conductive layer to form one or more confined regions including the first surface.

3. The method of claim 2 wherein the first insulation layer comprises silicon dioxide.

4. The method of claim 2 wherein the conductive layer is metal silicide comprising $TiSi_2$.

5. The method of claim 2 wherein the barrier layer is metal-nitride comprising TiN.

6. The method of claim 1 wherein the method of forming a second insulation layer on the first insulation layer further comprises:
    depositing the second insulation layer to cover the one or more source or drain regions on the first insulation layer; and
    performing a CMP process so as to form the second surface, the second surface being substantially co-planar with the first surface.

7. The method of claim 6 wherein the second insulation layer comprises silicon oxide deposited by high-density plasma enhanced chemical vapor deposition (HDP CVD).

8. The method of claim 6 wherein the second insulation layer comprises TEOS deposited silicon oxide.

9. The method of claim 1 wherein the method of forming a first p-type polysilicon layer further comprises:

depositing polycrystalline silicon using low-pressure CVD technique with $SiH_4/B_2H_6$ precursors at 520-560° C.; and annealing at 520-560° C. after deposition.

10. The method of claim 1 wherein the method of forming a first p-type polysilicon layer further comprises:

depositing polycrystalline silicon using low-pressure CVD technique with $Si_2H_6/B_2H_6$ precursors at 420-520° C.; and annealing at 420-520° C. after deposition.

11. The method of claim 1 wherein the silicon dioxide layers in block layer and tunnel layer is formed by using low pressure CVD technique with $SiH_4$ and $O_2$ precursors.

12. The method of claim 1 further comprising repeating the process steps to integrate the memory cell structures three-dimensionally.

13. A method of making a TFT floating gate memory cell structure, the method comprising:

providing a substrate;

forming a first insulation layer on the substrate;

forming one or more source or drain regions on the first insulation layer, each of the one or more source or drain regions being associated with a first surface and including an n-type polysilicon layer, a barrier layer, and a conductive layer, the n-type polysilicon layer being on the barrier layer, the barrier layer overlying the conductive layer, the first surface consisting of n-type polysilicon, the conductive layer comprising a metal silicide material;

forming a second insulation layer on the first insulation layer, the second insulation layer being located between the one or more source and drain regions and associated with a second surface, the second surface being substantially co-planar with the first surface;

forming a first p-type polysilicon layer overlying the first surface and the second surface, the first p-type polysilicon layer being capable of forming a channel from a source region to a drain region;

forming a silicon layer sandwiched by an upper silicon dioxide block layer and a bottom silicon dioxide tunnel layer on the first p-type polysilicon layer, the silicon layer being capable of forming a floating gate;

forming a second p-type polysilicon layer on the upper silicon dioxide block layer; and forming at least one control gate by patterning the second p-type polysilicon layer, wherein forming the silicon layer comprises:

depositing silicon using low-pressure CVD technique with $Si_2H_6$ precursor at 420-520° C.; and annealing at 420-520° C. after deposition.

14. The method of claim 13 wherein the forming the one or more source or drain regions on the first insulation layer comprises:

forming the conductive layer on the first insulation layer;

forming the barrier layer on the conductive layer;

forming the n-type polysilicon layer on the barrier layer; and patterning the n-type polysilicon layer, the barrier layer, and the conductive layer to form one or more confined regions including the first surface.

15. The method of claim 13 wherein the metal silicide material comprises titanium silicide and the barrier layer comprises titanium nitride.

16. The method of claim 13 wherein the forming the second insulation layer on the first insulation layer comprises:

depositing the second insulation layer to cover the one or more source or drain regions on the first insulation layer; and performing a CMP process so as to form the second surface, the second surface being substantially co-planar with the first surface.

17. The method of claim 13 wherein forming the first p-type polysilicon layer comprises:

depositing polycrystalline silicon using low-pressure CVD technique with $SiH_4/B_2H_6$ precursors at 520-560° C.; and annealing at 520-560° C. after deposition.

18. The method of claim 13 wherein forming the first p-type polysilicon layer comprises:

depositing polycrystalline silicon using low-pressure CVD technique with $Si_2H_6/B_2H_6$ precursors at 420-520° C.; and annealing at 420-520° C. after deposition.

19. A method of making a TFT floating gate memory cell structure, the method comprising:

providing a substrate;

forming a first insulation layer on the substrate;

forming one or more source or drain regions on the first insulation layer, each of the one or more source or drain regions being associated with a first surface and including an n-type polysilicon layer, a barrier layer, and a conductive layer, the n-type polysilicon layer being on the barrier layer, the barrier layer overlying the conductive layer, the first surface consisting of n-type polysilicon, the conductive layer comprising a metal silicide material;

forming a second insulation layer on the first insulation layer, the second insulation layer being located between the one or more source and drain regions and associated with a second surface, the second surface being substantially co-planar with the first surface;

forming a first p-type polysilicon layer overlying the first surface and the second surface, the first p-type polysilicon layer being capable of forming a channel from a source region to a drain region;

forming a silicon layer sandwiched by an upper silicon dioxide block layer and a bottom silicon dioxide tunnel layer on the first p-type polysilicon layer, the silicon layer being capable of forming a floating gate;

forming a second p-type polysilicon layer on the upper silicon dioxide block layer; and forming at least one control gate by patterning the second p-type polysilicon layer, wherein the at least one control gate is positioned over the silicon floating gate and the channel of a polysilicon TFT.

* * * * *